(12) United States Patent
Chan et al.

(10) Patent No.: US 9,853,109 B2
(45) Date of Patent: Dec. 26, 2017

(54) III-V MOSFET WITH SELF-ALIGNED DIFFUSION BARRIER

(71) Applicant: International Business Machines Corporation, Armonk, NY (US)

(72) Inventors: Kevin K. Chan, Staten Island, NY (US); Cheng-Wei Cheng, White Plains, NY (US); Jack Oon Chu, Manhasset Hills, NY (US); Yanning Sun, Scarsdale, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/135,655

(22) Filed: Apr. 22, 2016

(65) Prior Publication Data

US 2017/0092722 A1    Mar. 30, 2017

Related U.S. Application Data (62) Division of application No. 14/870,794, filed on Sep. 30, 2015.

(51) Int. Cl.
*H01L 29/08* (2006.01)
*H01L 29/417* (2006.01)
(Continued)

(52) U.S. Cl.
CPC .... *H01L 29/41783* (2013.01); *H01L 21/0262* (2013.01); *H01L 21/02546* (2013.01); *H01L 21/02631* (2013.01); *H01L 21/283* (2013.01); *H01L 21/28575* (2013.01); *H01L 21/32051* (2013.01); *H01L 21/32134* (2013.01); *H01L 29/0847* (2013.01); *H01L 29/20* (2013.01); (Continued)

(58) Field of Classification Search
CPC ............... H01L 29/41783; H01L 29/20; H01L 29/0847; H01L 29/78; H01L 29/66795; H01L 29/452; H01L 29/7835; H01L 29/66522; H01L 29/201; H01L 21/0262; H01L 21/28575; H01L 21/02631; H01L 21/02546; H01L 21/32051; H01L 21/283; H01L 21/32134; H01L 21/324
See application file for complete search history.

(56) References Cited

U.S. PATENT DOCUMENTS

| | | |
|---|---|---|
| 5,621,228 A | 4/1997 | Ando |
| 5,895,941 A | 4/1999 | Kitano |

(Continued)

*Primary Examiner* — Michael Trinh
(74) *Attorney, Agent, or Firm* — Louis J. Percello, Esq.; Otterstedt, Ellenbogen & Kammer, LLP (57) ABSTRACT

A method is presented for forming a diffusion barrier in a field effect transistor with a source. A raised source is formed at least partially on the source with the raised source comprising III-V material. An interfacial layer is formed at least partially on the raised source with the interfacial layer comprising silicon or germanium. A metal layer is formed at least partially on the interfacial layer with the metal layer comprising transition metal. The diffusion barrier is formed at least partially on the raised source with the diffusion barrier layer comprising transition metal from the metal layer bonded to silicon or germanium from the interfacial layer. Similar processing forms a corresponding diffusion barrier on a raised drain.

20 Claims, 9 Drawing Sheets

(51) Int. Cl.

| | |
|---|---|
| *H01L 29/201* | (2006.01) |
| *H01L 21/283* | (2006.01) |
| *H01L 21/3213* | (2006.01) |
| *H01L 29/78* | (2006.01) |
| *H01L 29/66* | (2006.01) |
| *H01L 21/3205* | (2006.01) |
| *H01L 21/02* | (2006.01) |
| *H01L 21/285* | (2006.01) |
| *H01L 29/20* | (2006.01) |
| *H01L 29/45* | (2006.01) |

(52) U.S. Cl.
CPC .......... *H01L 29/201* (2013.01); *H01L 29/452* (2013.01); *H01L 29/665* (2013.01); *H01L 29/66522* (2013.01); *H01L 29/66795* (2013.01); *H01L 29/78* (2013.01); *H01L 29/7835* (2013.01); *H01L 21/02576* (2013.01); *H01L 21/02579* (2013.01)

(56) References Cited

U.S. PATENT DOCUMENTS

| | | | |
|---|---|---|---|
| 5,907,164 A | 5/1999 | Nakayama | |
| 6,194,747 B1 | 2/2001 | Onda | |
| 6,248,637 B1* | 6/2001 | Yu | H01L 21/28123 |
| | | | 257/E21.206 |
| 6,391,696 B1* | 5/2002 | Onda | H01L 29/66462 |
| | | | 257/E21.407 |
| 6,524,920 B1* | 2/2003 | Yu | H01L 29/41783 |
| | | | 257/E21.438 |
| 7,221,005 B2 | 5/2007 | Ogura et al. | |
| 7,335,545 B2* | 2/2008 | Currie | H01L 21/76254 |
| | | | 257/E21.121 |
| 8,829,567 B2* | 9/2014 | Lee | H01L 29/205 |
| | | | 257/190 |
| 2015/0061010 A1* | 3/2015 | Cheng | H01L 29/0692 |
| | | | 257/344 |

* cited by examiner

III-V MOSFET WITH SELF-ALIGNED DIFFUSION BARRIER

CROSS-REFERENCE TO RELATED APPLICATIONS

This patent application is a divisional of U.S. patent application Ser. No. 14/870,794 filed Sep. 30, 2015, entitled "III-V MOSFET WITH SELF-ALIGNED DIFFUSION BARRIER." The complete disclosure of the aforementioned U.S. patent application Ser. No. 14/870,794 is expressly incorporated herein by reference in its entirety for all purposes.

FIELD

The present invention relates to the electrical, electronic, and computer arts, and, more particularly, to methods for forming diffusion barriers in Group III-V metal-oxide-semiconductor field effect transistors.

BACKGROUND

III-V materials are being actively studied for integration into both planar and three-dimensional, multi-gate metal-oxide-semiconductor field effect transistors (MOSFETs). Indium gallium arsenide (InGaAs), for example, is characterized by an extremely high electron mobility when compared to silicon, and is therefore attractive as a channel material. Nevertheless, despite the promise of increased device performance, manufacturable processing schemes capable of integrating III-V materials into MOSFET devices remains elusive because of several key technical challenges.

One such challenge occurs when trying to form self-aligned, low-resistance diffusion barriers that allow metallic contacts to be connected to source/drain features that are formed of III-V materials. While titanium and titanium nitride are used extensively as contact diffusion barriers for silicon-based technologies, titanium, when deposited on a feature comprising InGaAs, may alloy with elements of the InGaAs at temperatures as low as about 400° C. to form titanium arsenide compounds. These compounds are characterized by relatively high thin film resistivities. As a result, when depositing transition metals on InGaAs to form a diffusion barrier for metal contacts, the thermal budget of any subsequent processes associated with back-end-of-line (BEOL) processing may be severely restricted so as to avoid this unwanted alloying. Unfortunately, such a restriction does not lend itself to the manufacture of high-performance devices.

SUMMARY

Embodiments of the invention provide methods for forming diffusion barriers on Group III-V MOSFETs that provide superior electrical performance while maintaining adequate thermal budgets for BEOL processing, as well as MOSFETs so formed.

Aspects of the invention are directed to a method for forming a field effect transistor with a source. A raised source is formed at least partially on the source with the raised source comprising Group III-V material. An interfacial layer is formed at least partially on the raised source with the interfacial layer comprising silicon or germanium. A metal layer is formed at least partially on the interfacial layer with the metal layer comprising transition metal. Lastly, a diffusion barrier is formed at least partially on the raised source with the diffusion barrier layer comprising transition metal from the metal layer bonded to silicon or germanium from the interfacial layer.

Additional aspects of the invention are directed to a field effect transistor formed at least in part by the steps according to one or more embodiments of the invention.

Even additional aspects of the invention are directed to a field effect transistor with a source, a raised source disposed at least partially on the source, and a diffusion barrier disposed at least partially on the raised source. The raised source comprises a Group III-V material. The diffusion barrier comprises a transition metal bonded with silicon or germanium.

Substantial beneficial technical effects are provided. For example, one or more embodiments may provide one or more of the following advantages:

Diffusion barriers formed having low thin film resistivities; and
Diffusion barriers having the ability to stop interdiffusion between subsequently formed metal contacts and the underlying III-V structures.

BRIEF DESCRIPTION OF THE DRAWINGS

These and other features, aspects, and advantages of the present invention will become better understood with regard to the following description, appended claims, and accompanying drawings, where:

DETAILED DESCRIPTION

The present invention will be described with reference to illustrative embodiments. For this reason, numerous modifications can be made to these embodiments and the results will still come within the scope of the invention. No limitations with respect to the specific embodiments described herein are intended or should be inferred.

As the term is used herein and in the appended claims, "about" means within plus or minus ten percent. Moreover, "III-V material" is material that comprises a combination of at least one Group III element (e.g., aluminum (Al), gallium (Ga), and indium (In)) and at least one Group V element (e.g., nitrogen (N), phosphorous (P), arsenic (As), and antimony (Sb)). Where chemical notations are provided herein, such as "InP," "InAlAs," and "InGaAs," such notations are intended to be short-form descriptors for chemical compounds and are not intended as formal molecular formula indicating the mole proportions of the constituent atoms in those compounds unless subscripts are explicitly provided. Thus, it is not to be assumed, for example, that reference to "InGaAs" is a reference to a compound having a 1:1:1 mole ratio of indium, gallium, and arsenic atoms. Instead, a compound falling within that short-form descriptor may comprise, as just one example, $In_{0.53}Ga_{0.47}As$.

Figure 1A:
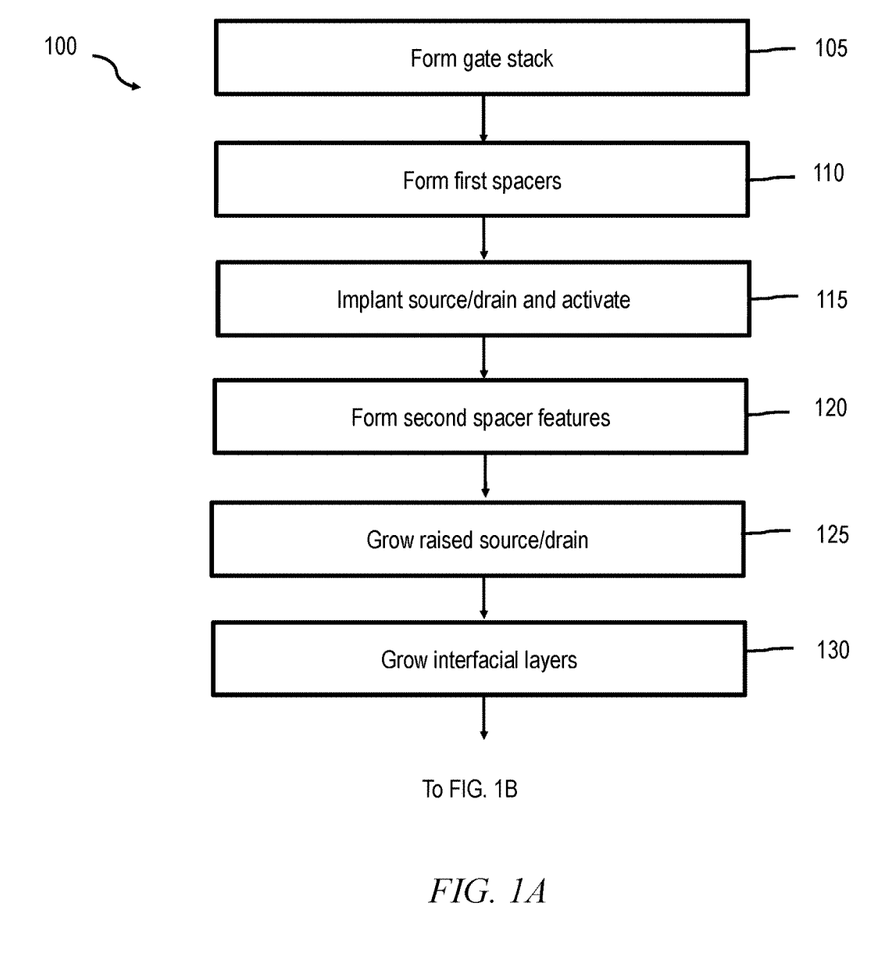
FIGS. 1A and 1B provide a flow diagram of a method for forming a planar field effect transistor, in accordance with an illustrative embodiment of the invention.
Figures 1B, 2:
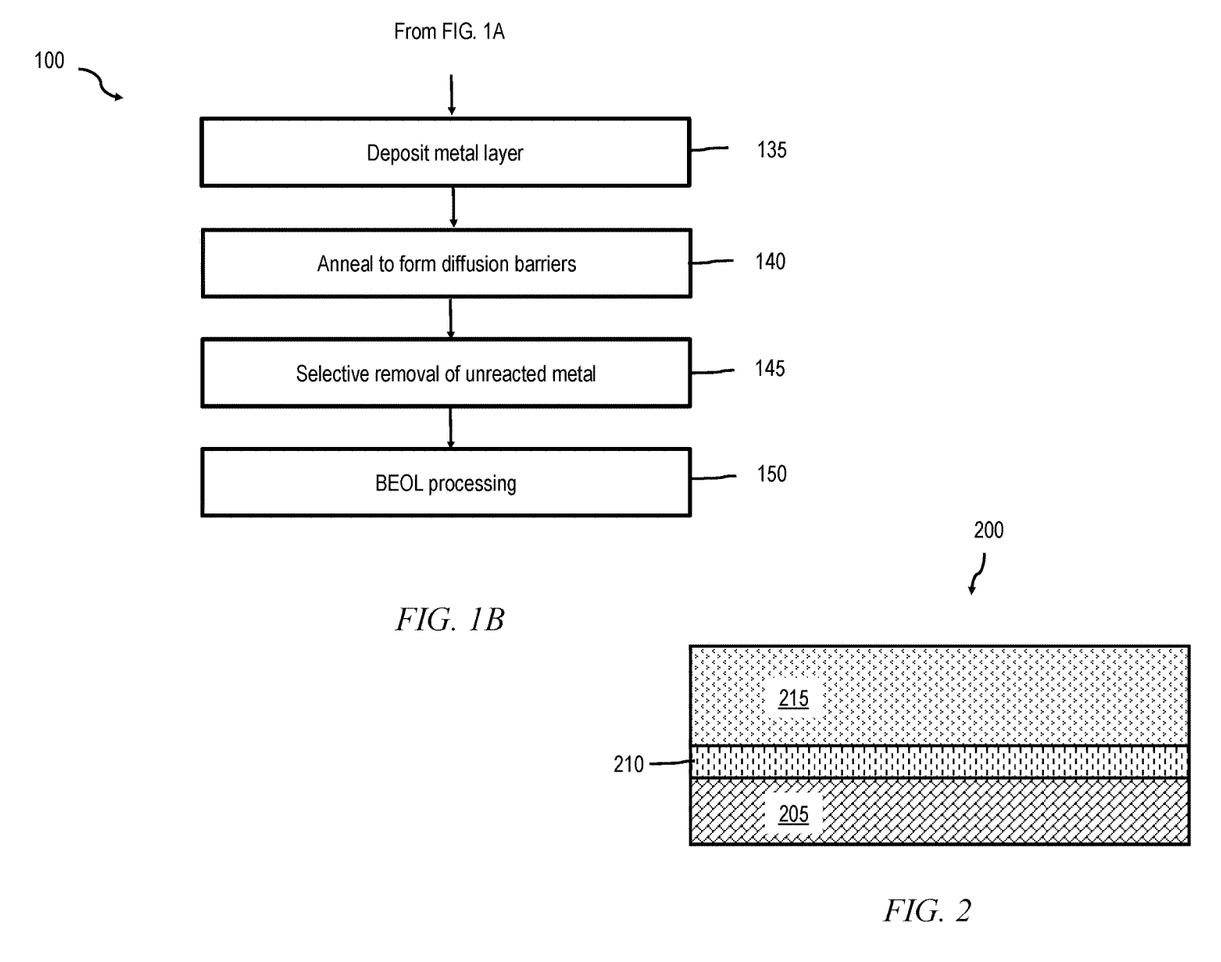
FIGS. 2-10 show sectional views of intermediate film stacks formed when performing the method in FIGS. 1A and 1B.

FIGS. 1A and 1B show a flow diagram of a method 100 in accordance with an illustrative embodiment of the invention for forming a planar field effect transistor (FET). FIGS. 2-10 show sectional views of intermediate film stacks formed during this processing. Although the method 100 and the structures formed thereby are entirely novel, at least some of the individual processing steps required to implement the method 100 may utilize conventional semiconductor fabrication techniques and conventional semiconductor fabrication tooling. These techniques and tooling will already be familiar to one having ordinary skill in the relevant arts given the teachings herein. In addition, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are both hereby incorporated by reference herein. It is also emphasized that, while some individual processing steps are set forth herein, those steps are merely illustrative and one skilled in the art may be familiar with several equally suitable alternatives that would also fall within the scope of the invention. At the same time, the method 100 provided in FIGS. 1A and 1B, for economy of description, omit certain routine processing steps required to form a functioning device, such as, for example, wet cleaning steps, but these additional steps will be familiar to one having ordinary skill in the relevant semiconductor fabrication arts.

Before detailing the steps in FIGS. 1A and 1B, it is assumed that a suitable base film stack 200 is provided. Such a base film stack 200 is shown in FIG. 2. The base film stack 200 comprises a substrate 205 covered with a buffer layer 210, which is further covered with a channel layer 215. In the present, non-limiting embodiment, these various layers are formed of III-V materials. More particularly, the substrate 205 comprises indium phosphide (InP), the buffer layer 210 comprises indium aluminum arsenide (InAlAs), and the channel layer 215 comprise InGaAs. The buffer layer 210 and the channel layer 215 are preferably grown epitaxially on the substrate 205. Such epitaxial growth may be by, for example, metal-organic chemical-vapor deposition (MOCVD) or molecular beam epitaxy (MBE). During MOCVD, the growth surface may be exposed to vapor-phase metal-organic reactants while being heated (e.g., to 650° C.). Reactor pressure may be around 100 Torr, and high purity nitrogen or hydrogen may be employed as the carrier gas. Trimethyl gallium, trimethyl aluminum, and trimethyl indium may be used as Group III precursors, while arsine may be used as the Group V precursor. Disilane and dimethyl zinc may be utilized to provide n-type and p-type doping, respectively. Epitaxial $In_{0.52}Al_{0.48}As$ and $In_{0.53}Ga_{0.47}As$ are lattice-matched to InP, and these formulations are preferred for the channel layer 215 and the buffer layer 210, respectively, but not required.

Figure 3:
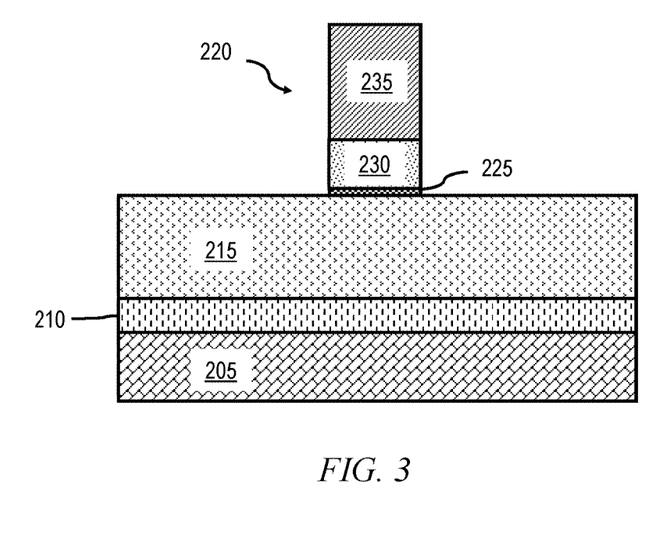

Step 105 in the method 100 involves the formation of a gate stack 220 on the base film stack 200 of FIG. 2 to yield the film stack shown in FIG. 3. The gate stack 220 comprises a gate dielectric 225, a gate metal 230, and a gate hard mask 235. In the present non-limiting embodiment, the gate dielectric 225 comprises a high-k dielectric such as aluminum oxide, the gate metal 230 comprises a metal such as tungsten, and the gate hard mask 235 comprises another dielectric material such as silicon nitride. These various layers may be deposited by atomic layer deposition (ALD) and/or chemical vapor deposition (CVD), and then patterned by conventional photolithography and reactive ion etching (RIE). As the name would suggest, the gate hard mask 235 may be used as a hard mask when etching the gate metal 230 and the gate dielectric 225.

Figure 4:
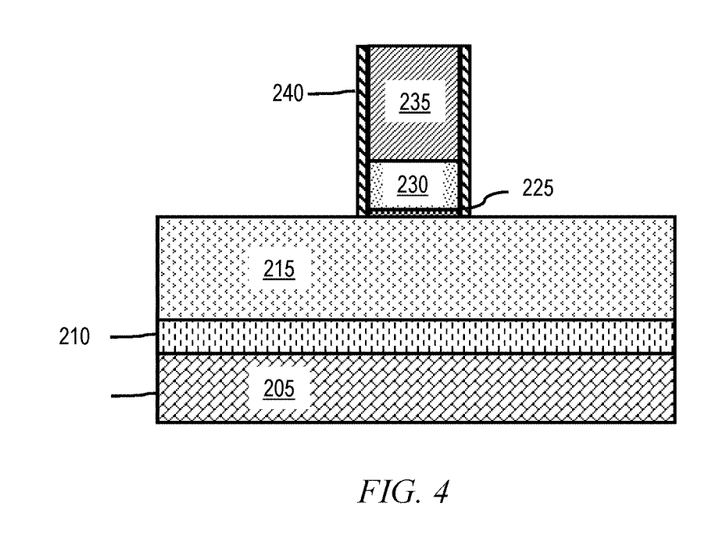
Figure 5:
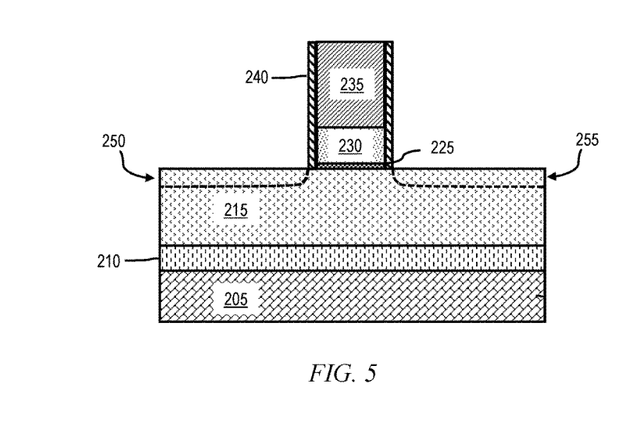

Step 110 involves forming first spacers 240 on the sidewalls of the gate stack 220 to form the film stack shown in FIG. 4. In one or more embodiments, the first spacers 240 may comprise the same material as the gate hard mask 235, namely silicon nitride. Spacer formation may be by deposition via CVD followed by anisotropic RIE to remove the excess material from the horizontal surfaces. After forming the first spacers 240, ion implantation is performed in step 115 to form a shallow, highly-doped source 250 and a shallow, highly-doped drain 255 in the uppermost region of the channel layer 215. The resultant film stack is shown in FIG. 5. The gate stack 220 and the first spacers 240 act as masks during the implant, causing the implant to be self-aligned to these features. The dopant may be silicon when forming an n-type field effect transistor (NFET). Activation of the dopants may follow by rapid thermal annealing (RTA).

Figure 6:
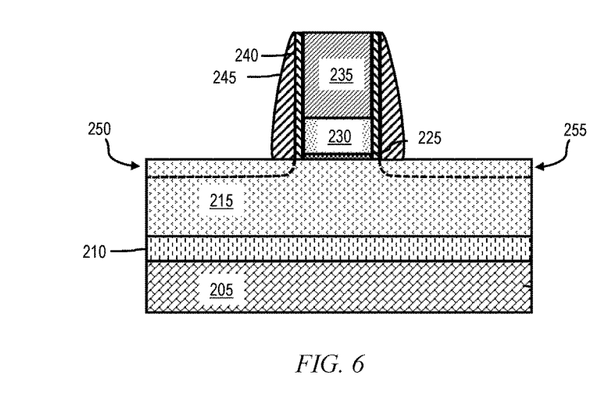

In step 120, second spacers 245 are formed on the sides of the first spacers 240 to form the film stack shown in FIG. 6. The second spacers 245 may comprise the same material as the first spacers 240 and the gate hard mask 235, for example, silicon nitride. Like the first spacers 240, the second spacers 245 may be formed by deposition and ME. The second spacers 245 may be wider than the first spacers 240 since the second spacers 245 are not used as masks for implanting the source 250 and the drain 255, but only as additional dielectric material surrounding the gate stack 220.

Figure 7:
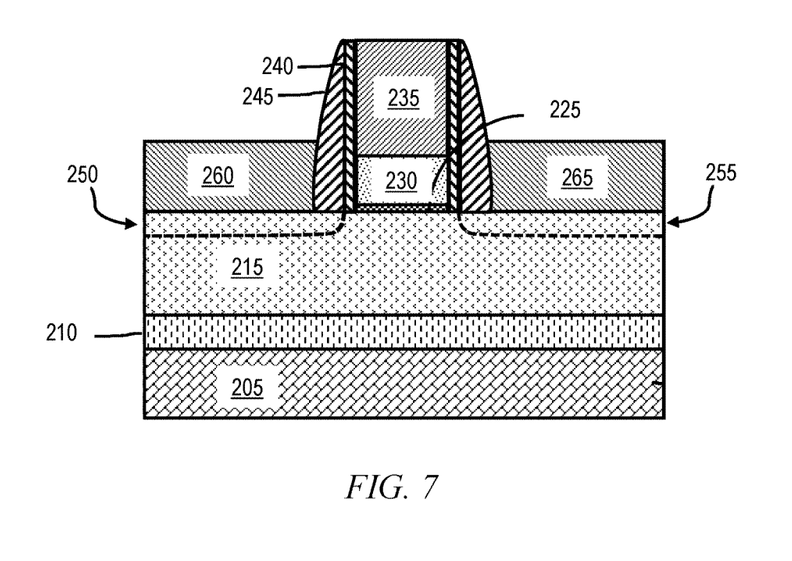

Step 125 involves the formation of a raised source 260 and a raised drain 265 on the source 250 and the drain 255, respectively, to yield the film stack shown in FIG. 7. The raised source 260 and the raised drain 265 preferably comprise the same material as the underlying source and drain 250, 255, in this particular embodiment, silicon-doped InGaAs. Deposition is preferably via in-situ doped epitaxial growth that only occurs on the exposed InGaAs of the source 250 and the drain 255, and does not occur significantly on the exposed gate hard mask 235 and spacers 240, 255 (in this particular embodiment, being formed of silicon nitride). Such selective epitaxial growth may be performed by MOCVD or MBE in a manner similar to growing the channel layer 215 when preparing the base film stack 200. Such growth may not occur significantly on dielectrics such as silicon nitride and silicon dioxide.

Figure 8:
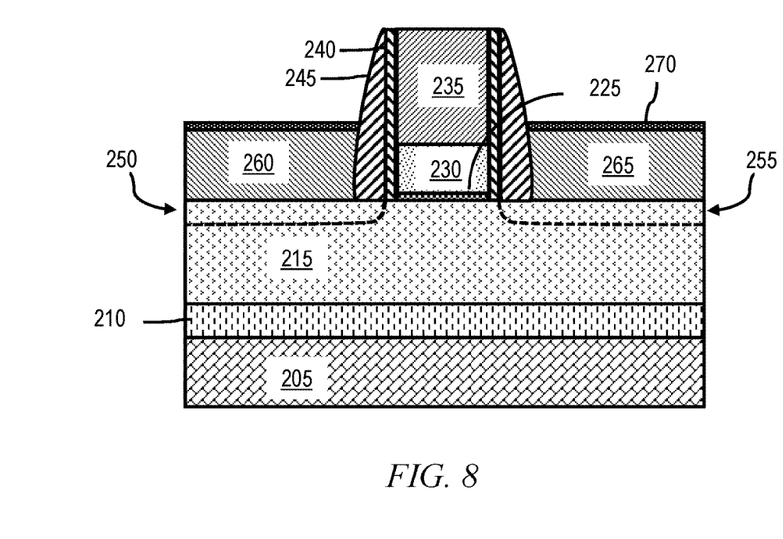

Next in step 130, interfacial layers 270 are grown on the raised source 260 and the raised drain 265 to obtain the film stack shown in FIG. 8. In accordance with aspects of the invention, the interfacial layers 270 comprise silicon, germanium, or a combination thereof (hereinafter referred to as "silicon-germanium"). Deposition may again be via selective epitaxial growth process that occurs on the raised source 260 and the raised drain 265 without significant concurrent deposition on the exposed regions of the gate hard mask 235 and the spacers 240, 245. Epitaxial growth of silicon, germanium, and silicon-germanium selective to dielectrics such as silicon dioxide and silicon nitride may be performed via rapid thermal CVD (RTCVD) and ultra-high vacuum CVD (UHVCVD). When growing germanium on InGaAs, for example, germane was mixed with hydrogen and helium at about 300° C. at about 1-10 mTorr pressure (with chamber base pressure at less than about $1\times10^{-9}$ Torr). Before deposition, the exposed InGaAs was exposed to hydrogen at about 300-500° C. to desorb any surface oxides.

Figure 9:
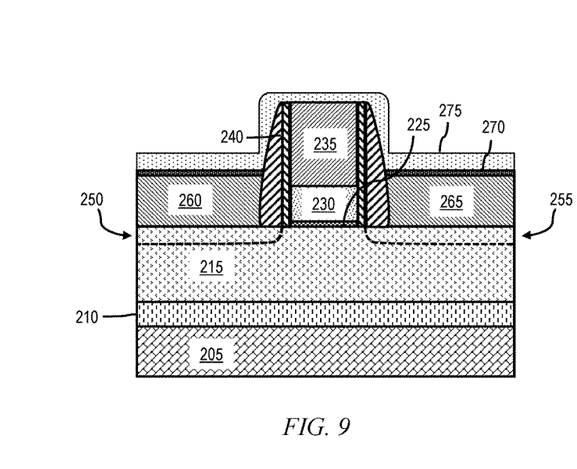

Step 135 sets forth the deposition of a metal layer 275 on the film stack in FIG. 8 to yield the film stack in FIG. 9. The metal layer 275 preferably comprises a transition metal such as, but not limited to, titanium, nickel, cobalt, or tungsten. In one or more embodiments, the metal layer 275 may comprise, for example, titanium metal topped with a layer of titanium nitride. The titanium nitride cap temporarily protects the underlying titanium from oxidation and other environmental degradation during processing. Deposition may be via physical vapor deposition (PVD; also called sputtering) or CVD. In PVD, titanium is sublimated and reacted with nitrogen in a high-energy, vacuum environment. Deposition by PVD will occur on all exposed surfaces of the film stack, including on top of the gate stack 220 and spacers 240, 245, as indicated in FIG. 9.

Figure 10:
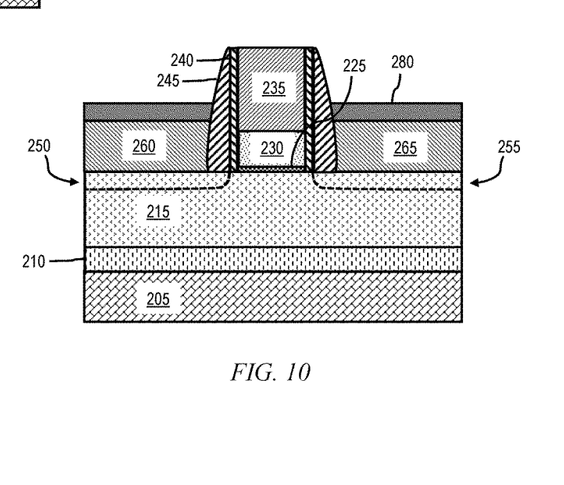

Steps 140 and 145 involve causing elements from the metal layer 275 to bond (i.e., react, alloy, or compound) with elements from the interfacial layers 270 to yield diffusion barriers that are positioned on the raised source 260 and the raised drain 265. In step 140, the film stack in FIG. 9 is annealed to cause titanium from the metal layer 275 to bond with silicon, germanium, or both silicon and germanium from the interfacial layers 270. The ultimate compound may be represented formulaically as $Ti_xSi_y$, $Ti_xGe_y$, or $Ti_xSi_yGe_z$. Generally, $Ti_xGe_y$ with x equal to about one and y equal to about two is preferred because of its very low resistivity. Formation of $Ti_xGe_y$ with a germanium interfacial layer 270 was, for example, demonstrated utilizing RTA with peak temperatures around 500° C. With none of the interfacial layers 270 present on the gate stack 220 and the spacers 240, 245, the portions of the metal layer 275 deposited thereon remain unreacted during this annealing. Next, in step 145, the unreacted portions of the metal layer 275 are selectively removed from the film stack while the $Ti_xSi_y$, $Ti_xGe_y$, or $Ti_xSi_yGe_z$ layers are allowed to remain. Such selective etching has been demonstrated utilizing a wet etchant comprising hydrogen peroxide. Ultimately, the film stack in FIG. 10 is formed, with diffusion barriers 280 comprising $Ti_xSi_y$, $Ti_xGe_y$, or $Ti_xSi_yGe_z$ disposed solely on top of the raised source 260 and the raised drain 265. In this manner, the diffusion barriers 280 are self-aligned to the gate stack 220.

Step 150 involves performing the remaining back-end-of-line (BEOL) processing on the film stack in FIG. 10 to complete formation of the desired device. Such BEOL processing may include landing metal contacts (e.g., tungsten, copper, aluminum) on the diffusion barriers 280 so as to provide electrical connections to the source 250 and the drain 255 of the underlying MOSFET. Advantageously, $Ti_xSi_y$, $Ti_xGe_y$, or $Ti_xSi_yGe_z$ diffusion barriers 280 formed in the manner set forth above provide a low resistance pathway between metal contacts and the raised source 260 and the raised drain 265, while, at the same time, preventing interdiffusion between the metal contacts and the underlying III-V structures. BEOL processing may utilize processing steps with temperatures as high as about 500° C. without adversely affecting the diffusion barriers 280, enabling implementation of most standard BEOL thermal budgets.

The film stack in FIG. 10 may be compared to an alternative film stack in which a metal layer comprising titanium and titanium nitride is deposited directly on the InGaAs raised source/drain without benefit of the novel intervening silicon, germanium, or silicon-germanium interfacial layer 270 in the manner set forth above. Titanium adversely reacts with InGaAs at temperatures around 400° C. During such a reaction, arsenic may segregate from the InGaAs, both modifying the InGaAs and forming an $Ti_xAs_y$ interface, which tends to exhibit a relatively high thin film resistivity. Accordingly, if titanium were deposited directly on the InGaAs in this manner, one would be restricted to temperatures lower than about 400° C. in subsequent processing to avoid this unwanted segregation, severely reducing the thermal budget of the BEOL processing.

Figure 11:
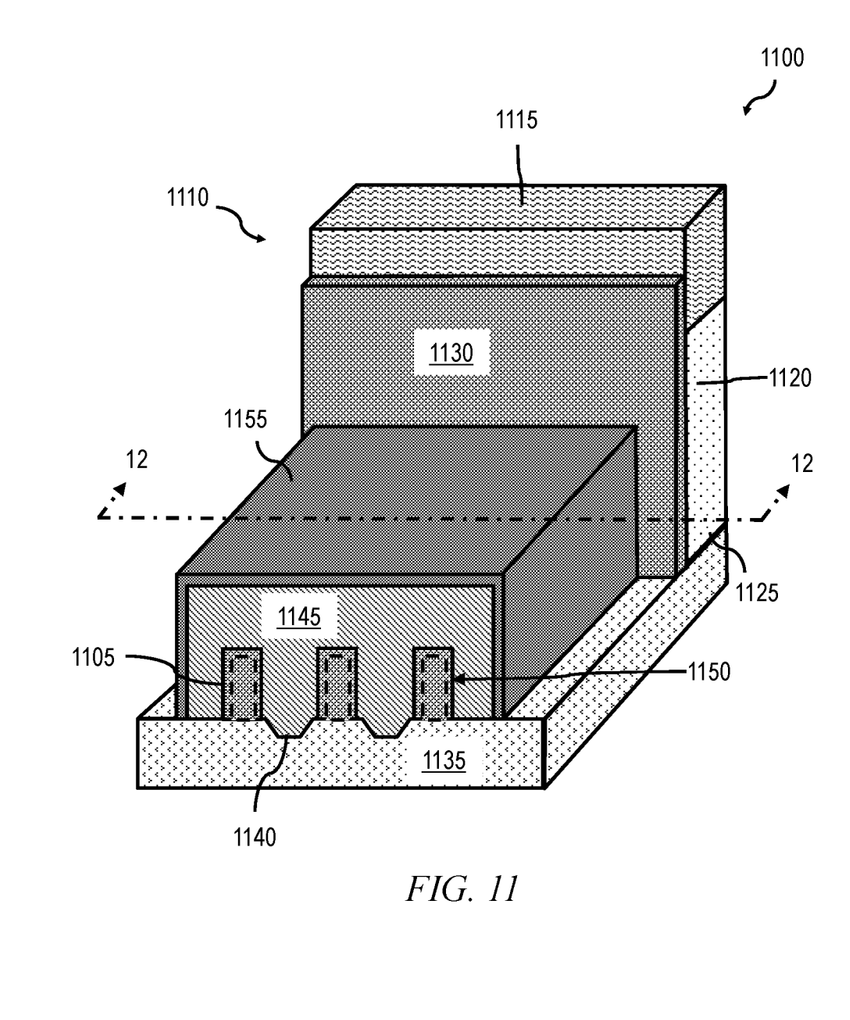
FIG. 11 shows a broken perspective view of a portion of a FinFET in accordance with an illustrative embodiment of the invention.

While FIGS. 1A-10 describe the formation of novel diffusion barriers on a planar III-V MOSFET, aspects of the invention may also be applied to three-dimensional, multigate MOSFETs. FIG. 11, for example, shows a partially broken sectional view of a portion of a FinFET 1100, in accordance with an illustrative embodiment of the invention. Only the gate and source region of the FinFET 1100 are shown for clarity of description, but the drain region will essentially be a mirror-image of the source region that is shown. As such, it will become apparent to those skilled in the art that methodologies used to form the source region, as described herein, may be similarly applied to formation of the drain region, according to one or more embodiments of the invention.

The illustrative FinFET 1100 comprises several fins (e.g., InGaAs) that pass through a gate stack 1110 so that the gate stack 1110 capacitively couples to three respective sides of each fin 1105. The gate stack 1110 comprises a gate hard mask 1115 (e.g., silicon nitride) that overlies a gate metal 1120 (e.g., tungsten) and a gate dielectric 1125 (e.g., aluminum oxide). The gate stack 1110 is abutted by a spacer 1130 (e.g., silicon nitride). The gate stack 1110 and the fins 1105 are disposed on a buried oxide layer 1135 (e.g., silicon dioxide or silicon nitride) with recessed regions 1140 between each of the fins 1105. A raised source 1145 (e.g., silicon-doped InGaAs) overlies the fins. The edges of the fins 1105 in the source region include highly-doped regions that form sources 1150, which may be doped with silicon by ion implantation after forming the raised source 1145.

A diffusion barrier 1155 similar to that described above for the planar MOSFET overlies the raised source 1145 feature in FIG. 11. Advantageously, this diffusion barrier 1155 may be formed by a method similar to the method 100 described with reference to FIGS. 1A and 1B. FIGS. 12-15 show sectional views along the plane indicated in FIG. 11 of intermediate film stacks during such formation.

Figure 12:
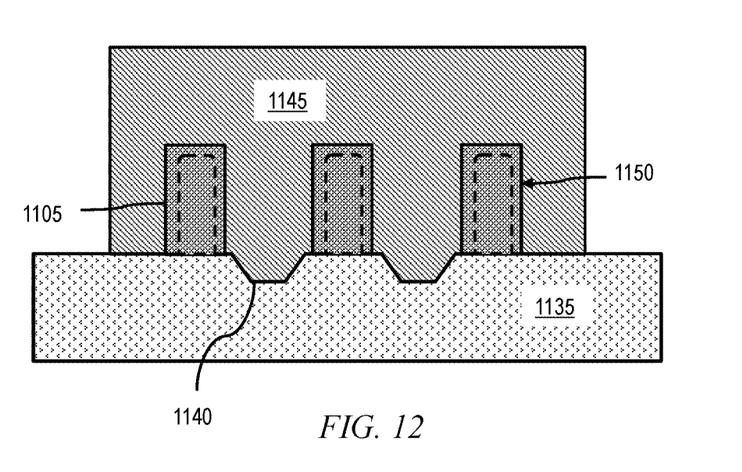
FIGS. 12-15 show sectional views of intermediate film stacks formed when manufacturing the FIG. 11 FinFET.
Figure 13:
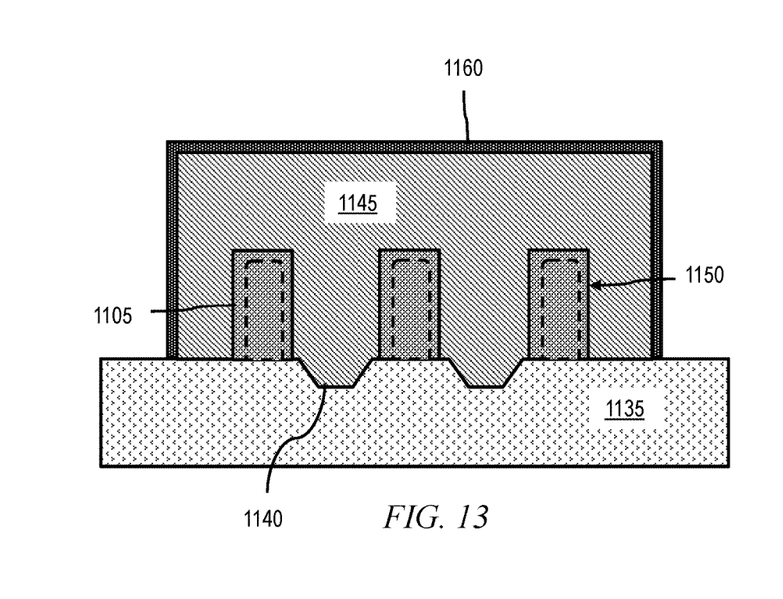

FIG. 12, for example, shows the film stack after forming the fins 1105, the gate stack 1110, and the spacer 1130 on the buried oxide layer 1135, but before starting to form the diffusion barrier 1155. To begin forming the diffusion barrier 1155, an interfacial layer 1160 may be selectively grown on the raised source 1145 in a manner similar to that set forth in step 130 (FIG. 1A) to obtain the film stack shown in FIG. 13. As before, the interfacial layer 1160 may comprise silicon, germanium, or silicon-germanium grown selectively by RTCVD of UHVCVD. Subsequently a metal layer 1165 comprising transition metal may be deposited on the film stack in a manner similar to that set forth in step 135 (FIG. 1B) to achieve the film stack shown in FIG. 14. Again, as before, the metal layer 1165 may comprise titanium and titanium nitride deposited by PVD.

Figure 14:
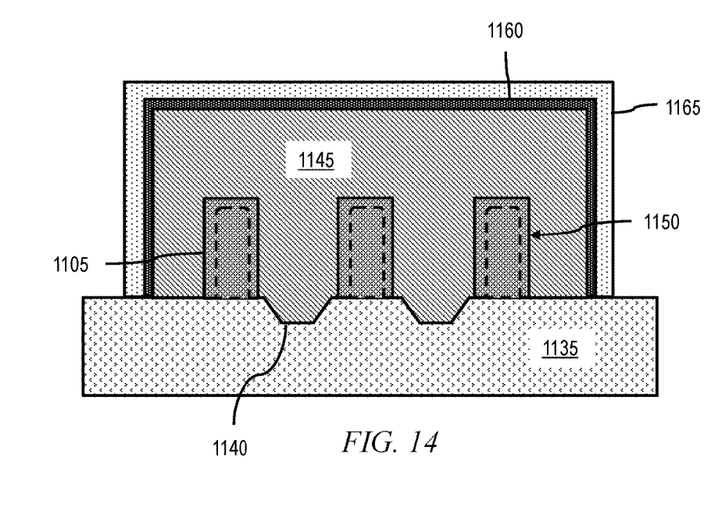
Figure 15:
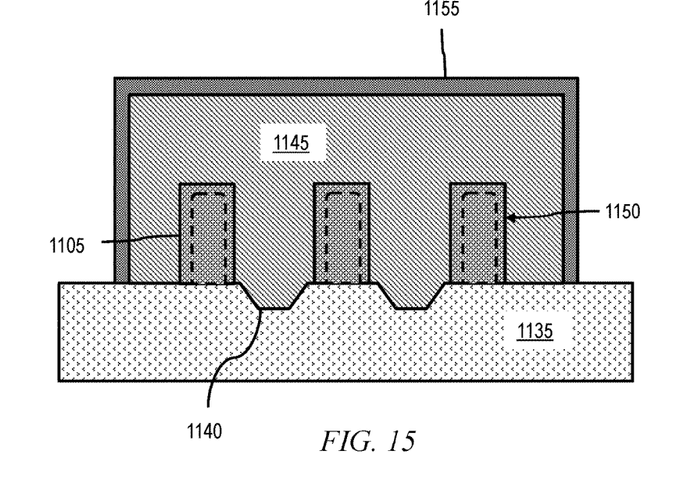

FIG. 15 shows the result of performing steps in a manner similar to those set forth in steps 140 and 145, namely, annealing the film stack in FIG. 14 to compound titanium from the metal layer 1165 with silicon, germanium, or silicon-germanium from the interfacial layer 1160, and then utilizing a wet etchant (e.g., hydrogen peroxide) to remove unreacted metal from the remainder of the film stack. The film stack in FIG. 15 includes the diffusion barrier 1155 on the raised source 1145, and corresponds to the portion of the FinFET 1100 shown in FIG. 11. So formed, the diffusion barrier 1155 is positioned so as to provide a low resistance pathway between a subsequently deposited metal contact and the raised source 1145, while also limiting interdiffusion between these two elements. A similar diffusion barrier on the drain side of the gate stack 1110 is also formed, but is not visible in the figures.

The methods described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. These integrated circuits and end products would also fall within the scope of the invention.

In closing, it should again be emphasized that the above-described embodiments of the invention are intended to be illustrative only. Other embodiments may, for example, utilize different materials and processing steps from those expressly set forth above to achieve embodiments falling within the scope of the invention.

As one example, rather than comprising aluminum oxide, a gate dielectric may comprise an alternative high-k metal oxide such as, but not limited to, $HfO_2$, $ZrO_2$, $La_2O_3$, $TiO_2$, $SrTiO_3$, $LaAlO_3$, $Y_2O_3$, $HfO_3N_y$, $ZrO_xN_y$, $La_2O_xN_y$, $Al_2O_xN_y$, $TiO_xN_y$, $SrTiO_xN_y$, $LaAlO_xN_y$, or $Y_2O_xN_y$. As another example, a gate metal may comprise heavily-doped polysilicon or aluminum. As even another example, rather than comprising silicon nitride, spacers may comprise silicon dioxide, silicon oxynitride, or boron nitride. Beyond material selection, moreover, in even additional embodiments of the invention, substitute processing methods for those explicitly provided above may be utilized to form aspects of the invention. For example, MBE may in some cases be substituted for CVD, surface drive-in may in some cases replace ion implantation, chemical mechanical polishing (CMP) and/or wet etching may in some cases replace or assist RIE, and so forth. These many variations, and others, will be familiar to one having ordinary skill in the art.

All the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. §112(f). In particular, the use of "steps of" in the claims herein is not intended to invoke the provisions of AIA 35 U.S.C. §112(f).

What is claimed is:

1. A method for forming a field effect transistor with an implanted source, the method comprising the steps of:
    forming a gate stack on a channel layer of the field effect transistor;
    forming a first spacer on a sidewall of the gate stack, the implanted source being self-aligned with the gate stack and the first spacer;
    forming a raised source at least partially on the implanted source after formation of the implanted source, the raised source comprising III-V material;
    forming an interfacial layer at least partially on the raised source, the interfacial layer comprising at least one of silicon and germanium;
    forming a metal layer at least partially on the interfacial layer, the metal layer comprising transition metal; and
    forming a diffusion barrier at least partially on the raised source, the diffusion barrier comprising transition metal from the metal layer bonded to the at least one of silicon and germanium from the interfacial layer.

2. The method of claim 1, wherein the raised source comprises indium gallium arsenide.

3. The method of claim 1, wherein forming the raised source comprises epitaxial growth.

4. The method of claim 3, wherein the epitaxial growth is via chemical vapor deposition or molecular beam epitaxy.

5. The method of claim 1, wherein forming the interfacial layer comprises epitaxial growth of the interfacial layer on the raised source selective to an exposed dielectric material.

6. The method of claim 5, wherein the epitaxial growth is via chemical vapor deposition.

7. The method of claim 1, wherein the metal layer comprises titanium.

8. The method of claim 1, further comprising the step of etching to remove transition metal from the metal layer that is not bonded with silicon or germanium from the interfacial layer.

9. The method of claim 8, wherein the etching comprises wet etching in a solution comprising hydrogen peroxide.

10. The method of claim 1, wherein forming the diffusion barrier comprises annealing configured to cause at least one element from the metal layer to bond with at least one element from the interfacial layer.

11. The method of claim 10, wherein the annealing comprises heating to greater than about 500 degrees Celsius.

12. The method of claim 1, wherein the interfacial layer comprises both silicon and germanium.

13. The method of claim 1, wherein the diffusion barrier comprises a compound consisting essentially of titanium bonded to germanium.

14. The method of claim 1, wherein the field effect transistor is a planar field effect transistor.

15. The method of claim 1, wherein the field effect transistor is a three-dimensional, multi-gate field effect transistor.

16. The method of claim 1, further comprising forming a second spacer on a side of the first spacer, the second spacer being formed prior to forming a raised source, the diffusion barrier being self-aligned with the first and second spacers and the gate stack.

17. A field effect transistor with an implanted source, the field effect transistor comprising:
    a gate stack formed on a channel layer of the field effect transistor;
    a first spacer formed on a sidewall of the gate stack, the implanted source being self-aligned with the gate stack and the first spacer;
    a raised source formed at least partially on the implanted source, the raised source comprising III-V material;
    an interfacial layer formed at least partially on the raised source, the interfacial layer comprising at least one of silicon and germanium;
    a metal layer formed at least partially on the interfacial layer, the metal layer comprising transition metal; and a diffusion barrier formed at least partially on the raised source, the diffusion barrier comprising transition metal from the metal layer bonded to the at least one of silicon and germanium from the interfacial layer.

18. The field effect transistor of claim 17, wherein the raised source comprises indium gallium arsenide.

19. The field effect transistor of claim 17, further comprising a second spacer formed on a side of the first spacer, the second spacer being located between the raised source and the first spacer, the diffusion barrier being self-aligned with the first and second spacers and the gate stack.

20. The field effect transistor of claim 17, wherein the diffusion barrier comprises a compound consisting essentially of titanium bonded to germanium.

* * * * *